US008497733B2

(12) United States Patent
Takahashi et al.

(10) Patent No.: US 8,497,733 B2
(45) Date of Patent: Jul. 30, 2013

(54) OFFSET CORRECTION CIRCUIT

(75) Inventors: Nobuo Takahashi, Gunma-ken (JP); Toru Dan, Gifu-ken (JP); Masashi Aramomi, Gunma-ken (JP); Yoshiyasu Kaneko, Fukaya (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 62 days.

(21) Appl. No.: 13/364,488

(22) Filed: Feb. 2, 2012

(65) Prior Publication Data
US 2012/0200351 A1   Aug. 9, 2012

(30) Foreign Application Priority Data
Feb. 4, 2011   (JP) ................................. 2011-023289

(51) Int. Cl.
*H03F 1/02* (2006.01)
(52) U.S. Cl.
USPC ............................................. 330/9; 327/124
(58) Field of Classification Search
USPC ................. 330/9, 254, 279; 327/124, 307
See application file for complete search history.

(56) References Cited

U.S. PATENT DOCUMENTS

| 4,006,428 | A  | * | 2/1977  | Meyer et al. | ..................... 330/51 |
| 4,377,759 | A  | * | 3/1983  | Ohhata et al. | ................. 327/337 |
| 7,132,882 | B2 | * | 11/2006 | Chen et al. | ........................ 330/9 |
| 7,411,446 | B2 | * | 8/2008  | Kao | ................................... 330/9 |
| 7,755,411 | B2 | * | 7/2010  | Isoda | ............................ 327/307 |
| 7,902,900 | B2 | * | 3/2011  | Liu et al. | ...................... 327/307 |

FOREIGN PATENT DOCUMENTS
JP           2004-172693 A       6/2004

OTHER PUBLICATIONS
Abstract of JP 2004-172693 A, printed from the Espacenet Worldwide Database, dated Jun. 17, 2004, 1 page.

\* cited by examiner

*Primary Examiner* — Henry Choe
(74) *Attorney, Agent, or Firm* — Osha Liang LLP

(57) ABSTRACT

The present invention quickly detects an offset and prevents cutoff of low frequency signals. Offset detection circuits smooth an output of a variable gain amplifier at a predetermined time constant and detects the offset, which is a DC component. The detected offset is added to the input of the variable gain amplifier by an adder and the offset in the output of the variable gain amplifier is corrected. The time constant in the offset detection circuit is changed by the resistance values of the variable resistors. Then, the time constant is changed to a small time constant when the gain of the variable gain amplifier is changed and thereafter to a large time constant.

7 Claims, 4 Drawing Sheets

OFFSET CORRECTION CIRCUIT

CROSS-REFERENCE TO RELATED APPLICATION(S)

The entire disclosure of Japanese Patent Application No. 2011-023289 filed on Feb. 4, 2011, including specification, claims, drawings, and abstract, is incorporated herein by reference in its entirety.

BACKGROUND

1. Technical Field

The present invention relates to an offset correction circuit for correcting an offset in an output of a variable gain amplifier.

2. Background Art

Hitherto, direct conversion radio receivers for converting a received signal directly into a baseband signal are known. Also called a zero-IF system, the direct conversion system has an IF (intermediate frequency) frequency of 0 Hz. Therefore, the spectrum of the IF signal has a distribution close to DC. For this reason, the IF section circuit basically requires DC coupling.

When the IF section circuit is DC coupled, DC offset becomes a problem. Namely, this is because the DC offset of the IF signal is amplified by an amplifier and sent to a subsequent stage resulting in an operating voltage range of the circuit being exceeded.

Therefore, it is necessary to detect the offset of the IF signal and cancel the offset. Patent document 1 discloses a specific configuration example.

Patent document 1: Japanese Patent Laid-Open Publication No. 2004-172693

SUMMARY OF THE INVENTION

Here, a variable gain amplifier (VGA) is used for the amplification of the IF signal and the gain is controlled according to the magnitude of the received signal. Therefore, when the VGA gain changes, an offset amount appearing in the output thereof also changes accordingly thereto.

In the high-speed radio systems of recent years, high-speed response is demanded. Particularly, in mobile communications, for example, when the VGA gain changes, it is necessary to converge on the offset in a short period.

Here, the detection of the offset amount requires the detection of the DC component in the VGA output and normally the DC offset obtained from a low-pass filter is fed back to the VGA input. However, when the time constant of the feedback of the DC offset is small, the low cutoff frequency for the system increases and the low frequency component of the zero-IF signal becomes attenuated. On the other hand, when the time constant of the DC feedback is large, the time until the offset is cancelled increases in the event the VGA gain fluctuates and the output DC offset fluctuates.

The present invention is an offset correction circuit for correcting an offset in an output of a variable gain amplifier, comprising an offset detection circuit for smoothing the output of the variable gain amplifier at a predetermined time constant and detecting the offset, which is a DC component, an adder for adding the detected offset to an input of the variable gain amplifier and correcting the offset in the output thereof, and time constant changing means for changing the time constant in the offset detection circuit, where the time constant changing means sets a small time constant when the gain of the variable gain amplifier is changed and thereafter changes to a large time constant.

Furthermore, it is preferable to have the time constant changing means stop offset detection when the time constant is large and set the time constant to infinity.

Furthermore, it is preferable to have the time constant changing means gradually increase the time constant when setting the time constant to infinity.

Furthermore, it is preferable to have the offset detection circuit include an integration circuit including a variable resistor and a capacitor, where the variable resistor includes a circuit connecting in parallel a plurality of serially connected resistors and switches, and the time constant changing means changes the time constant by on-off operation of the switches.

According to the present invention, offset cancellation can be performed quickly and cut off of the low frequency signal can be prevented.

DETAILED DESCRIPTION

Embodiments of the present invention will be described hereinafter with reference to the attached drawings.

Figure 1:
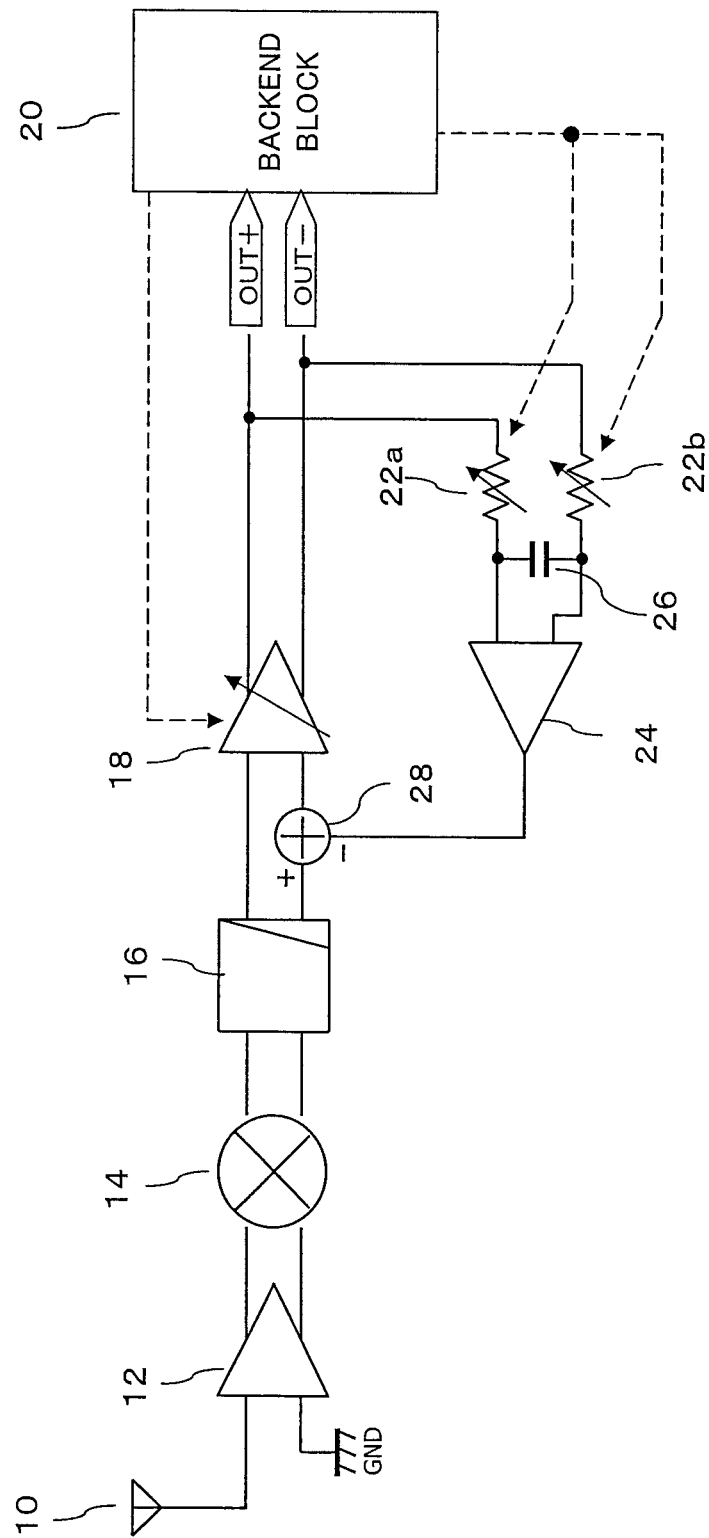
FIG. 1 shows a configuration of a radio receiver including an offset correction circuit relating to an embodiment.

FIG. 1 shows a configuration of a radio receiver including an offset correction circuit relating to the embodiment. A received radio wave at an antenna 10 is supplied via a low-noise amplifier 12 to a mixer 14. The mixer 14 is supplied with a local oscillator signal having the same carrier frequency as the received wave and at the output thereof a zero-IF signal having a baseband with the carrier removed is obtained.

After the undesired high frequency component has been removed at a low-pass filter 16, the zero-IF signal is supplied to a variable gain amplifier (VGA) 18 where amplification is performed to a predetermined level, and the amplified signal is input by a backend block 20.

In this example, a negative input terminal of the low-noise amplifier 12 is connected to ground and an output signal having both positive and negative polarities, and the mixer 14, the low-pass filter 16, and the VGA 18 also have inputs and outputs of both positive and negative polarities. The low-noise amplifier 12 and the VGA 18 are fully differential amplifiers.

The backend block 20 performs data processing, such as for demodulation, on the output signal of the VGA 18 after A/D conversion.

The positive (+) output of the VGA 18 via a variable resistor 22a and the negative (−) output of the VGA 18 via a variable resistor 22b are respectively input by positive and negative input terminals of a feedback amplifier 24. Furthermore, a capacitor 26 is provided across the positive and negative input terminals of the feedback amplifier 24.

Therefore, a DC component difference (DC offset voltage) of both positive and negative outputs of the VGA 18 charges the capacitor 26 and this voltage is amplified and output by the feedback amplifier 24. An adder 28 is provided in the input path to the negative input terminal of the VGA 18 and the output of the feedback amplifier 24 is supplied to the adder 28. The adder 28 may be provided in the input path to the positive input terminal of the VGA 18. Furthermore, the output of the feedback amplifier 24 may have a differential configuration and the adder 28 may be provided in the input path to both positive and negative terminals of the VGA 18.

In this configuration, feedback based offset cancellation is performed. Namely, by adding a DC voltage corresponding to the DC offset voltage charged in the capacitor 26 to the negative input of the VGA 18, the VGA 18 operates so that the DC components of the positive and negative outputs of the VGA 18 are identical. Therefore, by feeding back the output of the VGA 18 and adding the offset cancelled voltage to either the positive or negative input of the VGA 18, it becomes possible to cancel the offset.

It should be noted that although the two signals which have 180° phase difference are used in this embodiment, one may be set to ground level and a signal component may be carried on the other.

Here, the feedback system for offset cancellation has a predetermined time constant. Namely, the resistance values of variable resistors 22a and 22b and the capacitance value of the capacitor 26 determine the time constant, which thus defines the response of the feedback system. The smaller the time constant, the shorter the time until convergence. However, when a circuit having a small time constant is connected in this feedback system, the low cutoff frequency of the system increases and the desired low frequency signal to be transferred becomes attenuated.

Figure 2:
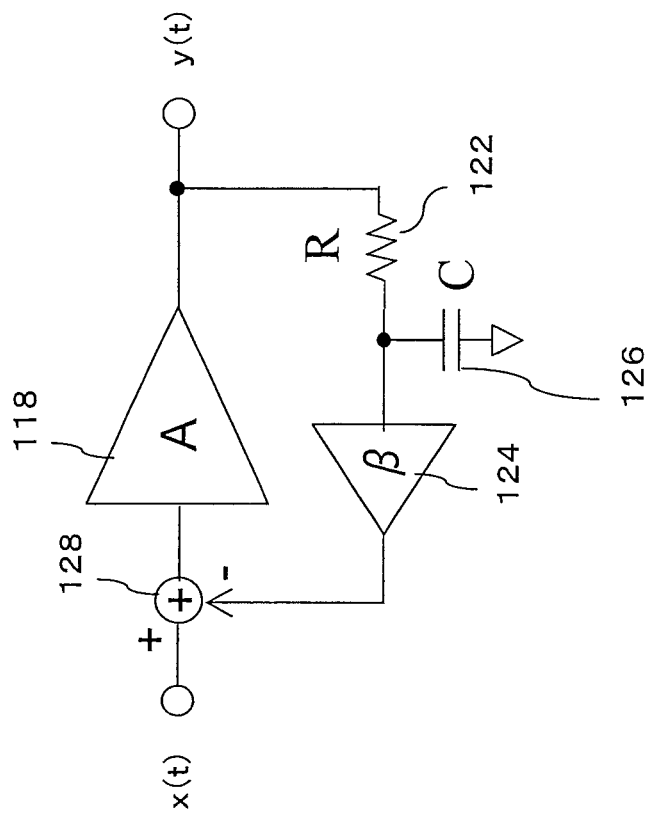
FIG. 2 shows a basic configuration of a feedback system for offset cancellation.

FIG. 2 shows a configuration example of the feedback system for offset cancellation. The gain of an amplifier 118 corresponding to the VGA 18 is A and the gain of a feedback amplifier 124 corresponding to the feedback amplifier 24 is β. Furthermore, the resistance value of a resistor 122 corresponding to the variable resistors 22a and 22b is R and the capacitance value of a capacitor 126 corresponding to the capacitor 26 is C.

The transfer function of this circuit is expressed for $H(j\omega)$):

$$H(j\omega)=A\{j\omega+(1/C\cdot R)\}/\{j\omega+(1+A\cdot\beta)/C\cdot R\}$$

The response y(t) with respect to a step waveform input in the circuit is expressed:

$$y(t)=A[1/(1+A\cdot\beta)+\{A\cdot\beta/(1+A\cdot\beta)\}\exp p[-(1+A\cdot\beta)t/C\cdot R]]$$

The DC gain $H(j\cdot 0)$, time constant τ, and low cutoff frequency fL are expressed:

$$H(j\cdot 0)=A/(1+A\cdot\beta)$$

$$\tau=C\cdot R/(1+A\cdot\beta)$$

$$fL=(1+A\cdot\beta)/2\pi C\cdot R$$

In this manner, when C·R is set small, the time constant τ becomes small while the low cutoff frequency fL increases signifying attenuation of the low frequency signal.

Here, for this circuit, A=100 times, β=10 times, and the offset voltage of the input conversion of the amplifier 118 is 10 mV.

If the feedback circuit for offset cancellation is not present, the 10 mV offset is amplified 100 times and the DC offset in the output of the amplifier 118 becomes 1 V.

On the other hand, the DC gain $H(j\cdot 0)$ in the circuit of FIG. 2 becomes 10 mV×A/(1+A·β)=10 mV×100/(1+100×10)≈1 mV. Therefore, 1 mV of charge is stored in the capacitor 126 and the output offset is suppressed to approximately 1 mV.

Here, the gain of the VGA 18 is switched by a signal from the backend block 20. For example, at the start of reception, the gain is changed according to the received signal strength. For example, in a vehicle mounted device where information is obtained from transmitters installed at intersections, radio waves are received from a transmitter at corresponding intersections during travel. Therefore, during communications for receiving provided information, the possibility is high for the gain of the VGA 18 to change each time.

In the embodiment, the backend block 20 detects the amplitude of the received signal and sets the gain of the VGA 18 accordingly, at which time the resistance values of the variable resistors 22a and 22b are changed. Namely, when the gain of the VGA 18 is changed, the resistance values of the variable resistors 22a and 22b are decreased and the time constant is set small.

Namely, according to the state of the received signal, the backend block 20 performs an AGC operation for changing the gain of the VGA 18 so that the signal that is input by the backend block 20 has a predetermined magnitude.

From the AGC operation, when the gain of the VGA 18 changes, the backend block 20 changes the variable resistors 22a and 22b to smaller values. As a result, the DC offset in the output of the VGA 18, which is changed by AGC operation, can be quickly cancelled. Then, when the AGC operation completes, the resistance values of the variable resistors 22a and 22b are gradually increased ultimately to infinity (for example, switched off). As a result, the voltage stored in the capacitor 26 is fixed and the state at the time is maintained. Thus, the presence of the feedback system eliminates the problem of low frequency signal cutoff for the signal.

Here, the resistance values of the variable resistors 22a and 22b are set to small values when the gain of the VGA 18 is changed due to AGC operation and are gradually increased and set to infinity at the completion of offset cancellation according to the time constant at the time.

This is because when the variable resistors 22a and 22b are disconnected by switches, the rapid change in the resistance values at the time may result in creating an offset value.

It is preferable to set the resistance values of the variable resistors 22a and 22b so that during AGC operation the time constant is set small and offset convergence takes less than several μs, such as 1 μs. Then, at the point of convergence, the resistance values of the variable resistors 22a and 22b may be changed to infinity over approximately 1-2 μs.

Figure 3:
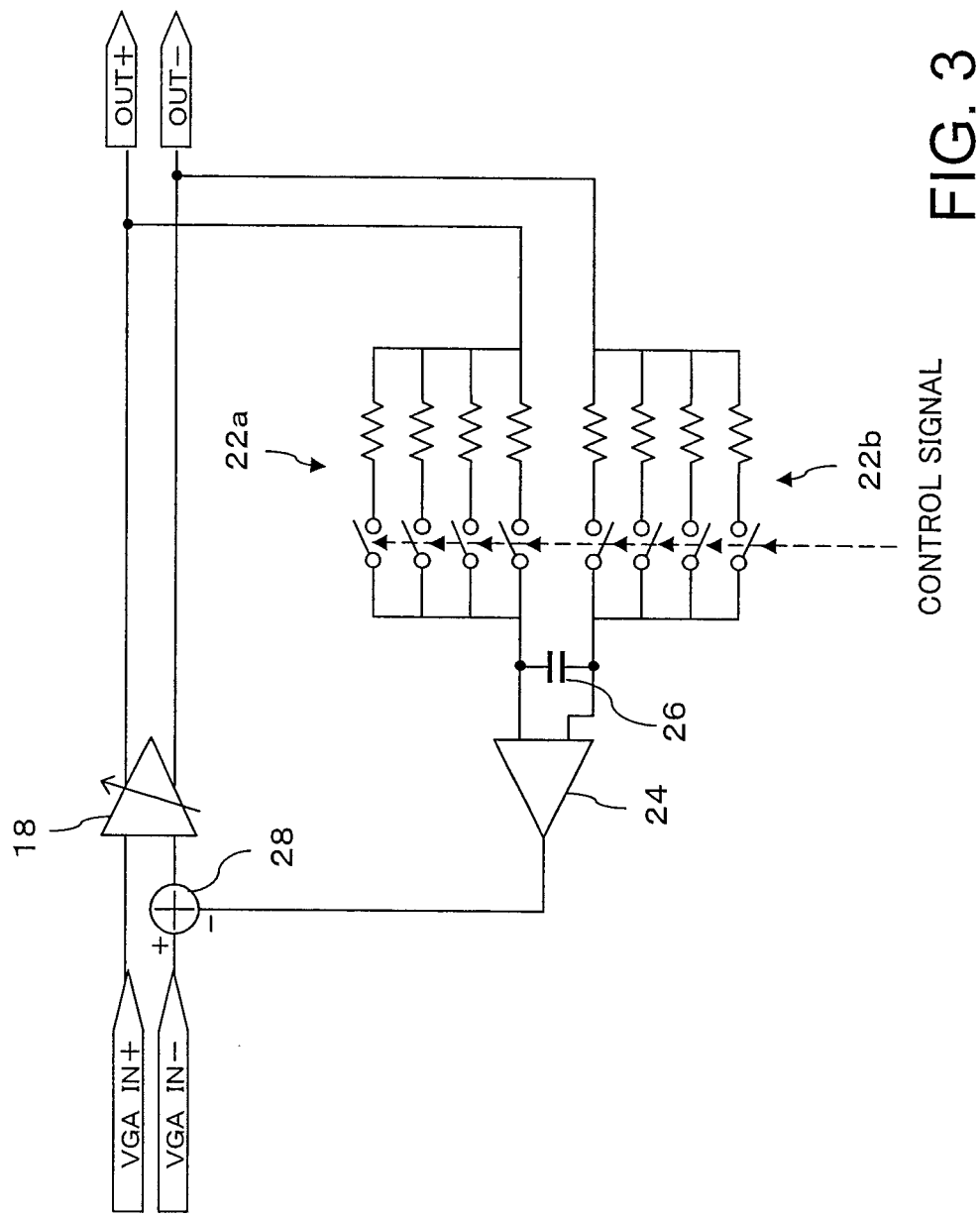
FIG. 3 shows a configuration example of variable resistors.

FIG. 3 shows a configuration example of the variable resistors 22a and 22b. In this example, the variable resistors 22a and 22b have a configuration wherein each has multiple serially connected resistors and switches (four each in this example) connected in parallel. Therefore, by turning on all four switches, four resistors become connected in parallel and the resistance value reaches a minimum. Then, by turning off all the switches, the resistance value becomes infinity.

For example, the switches are all on when the gain of the VGA 18 is changed by AGC and the switches are sequentially turned off at the completion of offset cancellation. As a result, the resistance values of the variable resistors 22a and 22b are gradually increased until the feedback system is finally disconnected. The on-off operations of the switches are performed at the same timing for the variable resistors 22a and 22b.

Figure 4:
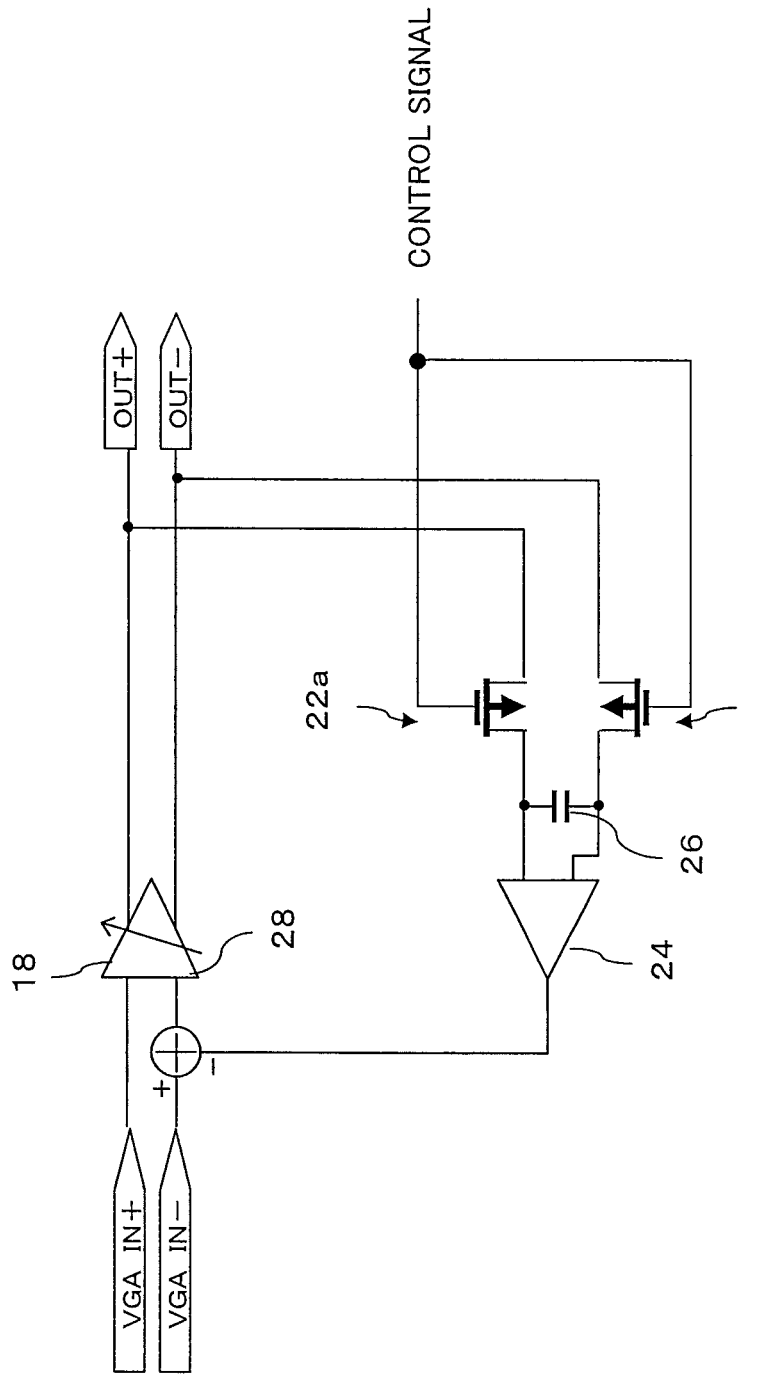
FIG. 4 shows another configuration example of variable resistors.

FIG. 4 shows an example where the variable resistors 22a and 22b are configured with transistors (MOSFET). Namely, in this example, the variable resistors 22a and 22b are each configured with one MOSFET. Therefore, controlling the gate voltage of the MOSFET enables the resistance value to be gradually turned off from a predetermined value. The MOSFET may be an n-channel or p-channel type.

In this manner, the embodiment detects an offset with a circuit having a small time constant when the gain of the VGA 18 is changed due to AGC operation and enables offset cancellation to be performed. Therefore, quick offset cancellation can be performed and sufficient data reception can be performed even in a vehicle radio communications device. Furthermore, since the feedback path is disconnected after the completion of operation, the low frequency signal is not cut off. Moreover, by gradually changing the time constant, the final remaining offset can be reduced.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. An offset correction circuit for correcting an offset in an output of a variable gain amplifier, comprising:
    an offset detection circuit for smoothing the output of said variable gain amplifier at a predetermined time constant and detecting the offset, which is a DC component;
    an adder for adding the detected offset to an input of said variable gain amplifier and correcting the offset in the output thereof; and
    time constant changing means for changing said time constant in said offset detection circuit, said time constant changing means sets a small time constant when the gain of said variable gain amplifier is changed and thereafter changes to a large time constant.

2. The offset correction circuit according to claim 1, wherein:
    said time constant changing means stops offset detection when the time constant is large and sets the time constant to infinity.

3. The offset correction circuit according to claim 1, wherein:
    said time constant changing means gradually increases the time constant to infinity when increasing the time constant.

4. The offset correction circuit according to claim 1, wherein:
    said offset detection circuit includes an integration circuit including a variable resistor and a capacitor, said variable resistor includes a circuit connecting in parallel a plurality of serially connected resistors and switches, and said time constant changing means changes the time constant by on-off operation of said switches.

5. The offset correction circuit according to claim 2, wherein:
    said time constant changing means gradually increases the time constant to infinity when increasing the time constant.

6. The offset correction circuit according to claim 2, wherein:
    said offset detection circuit includes an integration circuit including a variable resistor and a capacitor, said variable resistor includes a circuit connecting in parallel a plurality of serially connected resistors and switches, and said time constant changing means changes the time constant by on-off operation of said switches.

7. The offset correction circuit according to claim 3, wherein:
    said offset detection circuit includes an integration circuit including a variable resistor and a capacitor, said variable resistor includes a circuit connecting in parallel a plurality of serially connected resistors and switches, and said time constant changing means changes the time constant by on-off operation of said switches.

* * * * *